US009324906B2

(12) United States Patent
Nonomura

(10) Patent No.: US 9,324,906 B2
(45) Date of Patent: Apr. 26, 2016

(54) LED PACKAGE MANUFACTURING SYSTEM

(75) Inventor: Masaru Nonomura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 737 days.

(21) Appl. No.: 13/578,082

(22) PCT Filed: May 9, 2011

(86) PCT No.: PCT/JP2011/002578
§ 371 (c)(1),
(2), (4) Date: Aug. 9, 2012

(87) PCT Pub. No.: WO2012/032692
PCT Pub. Date: Mar. 15, 2012

(65) Prior Publication Data
US 2012/0316665 A1 Dec. 13, 2012

(30) Foreign Application Priority Data

Sep. 9, 2010 (JP) ................................ 2010-201654

(51) Int. Cl.
*G05B 19/18* (2006.01)
*H01L 33/00* (2010.01)
*H01L 33/50* (2010.01)
(52) U.S. Cl.
CPC ............ *H01L 33/0095* (2013.01); *H01L 33/50* (2013.01); *H01L 2224/48091* (2013.01); *H01L 2224/49107* (2013.01); *H01L 2224/73265* (2013.01); *H01L 2224/83192* (2013.01); *H01L 2224/92247* (2013.01); *H01L 2933/0041* (2013.01)

(58) Field of Classification Search
None
See application file for complete search history.

(56) References Cited

U.S. PATENT DOCUMENTS

2002/0130630 A1* 9/2002 Uchida ........................ 318/114
2006/0003477 A1* 1/2006 Braune ................. H01L 33/505
438/29

(Continued)

FOREIGN PATENT DOCUMENTS

CN 1679178 A 10/2005
CN 101355839 A 1/2009

(Continued)

OTHER PUBLICATIONS

International Search Report for PCT/JP2011/002578 dated Jun. 28, 2011.

(Continued)

*Primary Examiner* — Robert Fennema
*Assistant Examiner* — Md N Mia
(74) *Attorney, Agent, or Firm* — Pearne & Gordon LLP

(57) ABSTRACT

There are prepared element characteristic information 12 obtained by previously, individually measuring light emission characteristics of a plurality of LED elements and resin coating information 14 that correlates an appropriate amount of resin to be applied for acquiring an LED package exhibiting a specified light emission characteristic and the element characteristic information 12. A map preparation processing section 74 prepares, for each board, map data 18 correlating mounting position information 71a showing position of the LED element mounted on the board by a component mounting device M1 and the element characteristic information 12. There is updated the resin coating information 14 on the basis of an inspection result fed back to a resin coating device M4 as a result of a completed product coated with a resin being inspected by a light emission characteristic inspection device M7.

4 Claims, 12 Drawing Sheets

(56) References Cited

U.S. PATENT DOCUMENTS

| | | |
|---|---|---|
| 2009/0286335 A1 | 11/2009 | Le Toquin |
| 2010/0155750 A1* | 6/2010 | Donofrio .............. H01L 33/005 257/91 |
| 2011/0018026 A1 | 1/2011 | Konno et al. |

FOREIGN PATENT DOCUMENTS

| | | |
|---|---|---|
| JP | 2004-253745 A | 9/2004 |
| JP | 2005-056885 A | 3/2005 |
| JP | 2007-066969 A | 3/2007 |
| JP | 2009-272638 A | 11/2009 |
| JP | 2010-103349 A | 5/2010 |
| JP | 2010-177620 A | 8/2010 |
| JP | 2011-096936 A | 5/2011 |

OTHER PUBLICATIONS

Chinese Office Action for Application No. 201180013571.3 dated Feb. 10, 2015.

* cited by examiner

FIG. 4

| DENSITY OF FLUORESCENT SUBSTANCE (%) | BIN-SPECIFIC APPROPRIATE AMOUNT OF COATING (UNIT: n1) | | |
|---|---|---|---|
| | [1] | [2] | [3] |
| D1 | v11 | v12 | v13 |
| D2 | v12 | v22 | v23 |
| D3 | v32 | v32 | v33 |

US 9,324,906 B2

LED PACKAGE MANUFACTURING SYSTEM

TECHNICAL FIELD

The present invention relates to an LED package manufacturing system for manufacturing an LED package which is made by covering an LED element mounted on a board with a resin including a fluorescent substance.

BACKGROUND ART

An LED (light emitting diode) exhibiting superior characteristics; namely, lower power consumption and long operating life, are increasingly, extensively used as light sources for various lighting devices. The primary light rays emanating from an LED element are restricted for now to the three colors of red, green, and blue. Accordingly, in order to acquire white light suitable for general lighting applications, there is employed a technique for generating white light by subjecting the three primary light rays to additive color mixing or a technique for combining a blue LED with a phosphor substance that emits yellow fluorescent light which is complementary to a blue color, thereby generating pseudo white light. The latter technique has recently come into wide use, and a lighting device using an LED package including a combination of a blue LED with a YAG florescent substance are increasing used in backlight for a liquid crystal panel (see; for instance, Patent Document 1).

In an exemplification described in connection with the Patent Document, an LED element is mounted on a bottom surface of an indented mounting area where reflecting surfaces are formed on sidewalls. Subsequently, a silicone or epoxy resin including dispersed YAG-based fluorescent particles is poured in the mounting area, thereby forming a resin package section and thus manufacturing an LED package. There is described an example in which an excess resin storage for discharging an excess resin as a result of pouring of a specified amount of resin drain or more from the mounting section and storing the thus-discharged resin is formed with a view toward making uniform a height of a resin package section in the mounting section achieved after pouring of a resin. Even when variations exist in the amount of resin squirted from a dispenser during resin pouring operation, a resign package section that includes a given amount of resin and that has a specified height is thereby created on the LED element.

RELATED ART DOCUMENT

Patent Document

Patent Document 1: JP-A-2007-66969

DISCLOSURE OF THE INVENTION

Problem that the Invention is to Solve

However, the exemplification of the related art technique encounters a problem of variations that will arise in a light emitting characteristic of an LED package which will serve as a finished product, because of the variations in light emission wavelength of an individual LED element. Specifically, the LED element has already gone through a manufacturing process of collectively fabricating a plurality of elements on a wafer. It is inevitable that variations will arise in light emission wavelength of each of LED elements divided into pieces from a wafer for reasons of various error factors in the manufacturing process; for instance, irregularities in composition during formation of a film in a wafer. In the foregoing exemplification, the height of the resin package section covering the LED element is uniformly set. Therefore, variations in light emission wavelength of an individual LED element are directly reflected on variations in light emission characteristic of an LED package that serves as a product. The number of defectives deviating from a quality allowance range is forced to increase. As above, the related-art LED package manufacturing technique encounters a problem of variations in light emission characteristics of LED packages, which serve as finished products, attributing to variations in light emission wavelength of each of the LED elements, thereby resulting in deterioration of manufacturing yield.

Accordingly, the present invention aims at providing an LED package manufacturing system that makes light emission characteristics of LED packages uniform even when variations exist in light emission wavelength of individual LED elements, to thus enable enhancement of manufacturing yield.

Means for Solving the Problem

An LED package manufacturing system of the present invention is directed toward an LED package manufacturing system for manufacturing an LED package by coating an LED element mounted on a board with a resin including a fluorescent substance, comprising: a component mounting device that mounts a plurality of LED elements on the board; element characteristic information providing unit that provides, as element characteristic information, information obtained by previously, individually measuring light emission characteristics of the plurality of LED elements including their emission wavelengths; resin information providing unit that provides, as resin coating information, information about correspondence between an appropriate amount of resin to be applied for acquiring an LED package exhibiting a specified light emission characteristic and the element characteristic information; map data preparation unit that prepares, for each board, map data correlating mounting position information showing position of the LED element mounted on the board by the component mounting device and the element characteristic information about the LED element; a resin coating device that coats each of the LED elements mounted on the board with the appropriate amount of resin to be applied for imparting a specified light emission characteristic, on the basis of the map data and the resin coating information; a light emission characteristic inspection device that inspects the light emission characteristic of each of the LED elements coated with the resin to thereby detect a deviation from the specified light emission characteristic and that feeds back an inspection result to the resin coating device; and coating information update unit that performs processing for updating the resin coating information on the basis of the fed-back inspection result when the detected deviation exceeds an allowable value.

Advantage of the Invention

The present invention makes light emission characteristics of LED packages uniform even when variations exist in light emission characteristics of individual LED elements, thereby enabling enhancement of manufacturing yield.

BRIEF DESCRIPTION OF THE DRAWINGS

FIG. 4 is an explanatory view of resin coating information employed in the LED package manufacturing system of the embodiment of the present invention.

EMBODIMENT FOR IMPLEMENTING THE INVENTION

Figure 1:
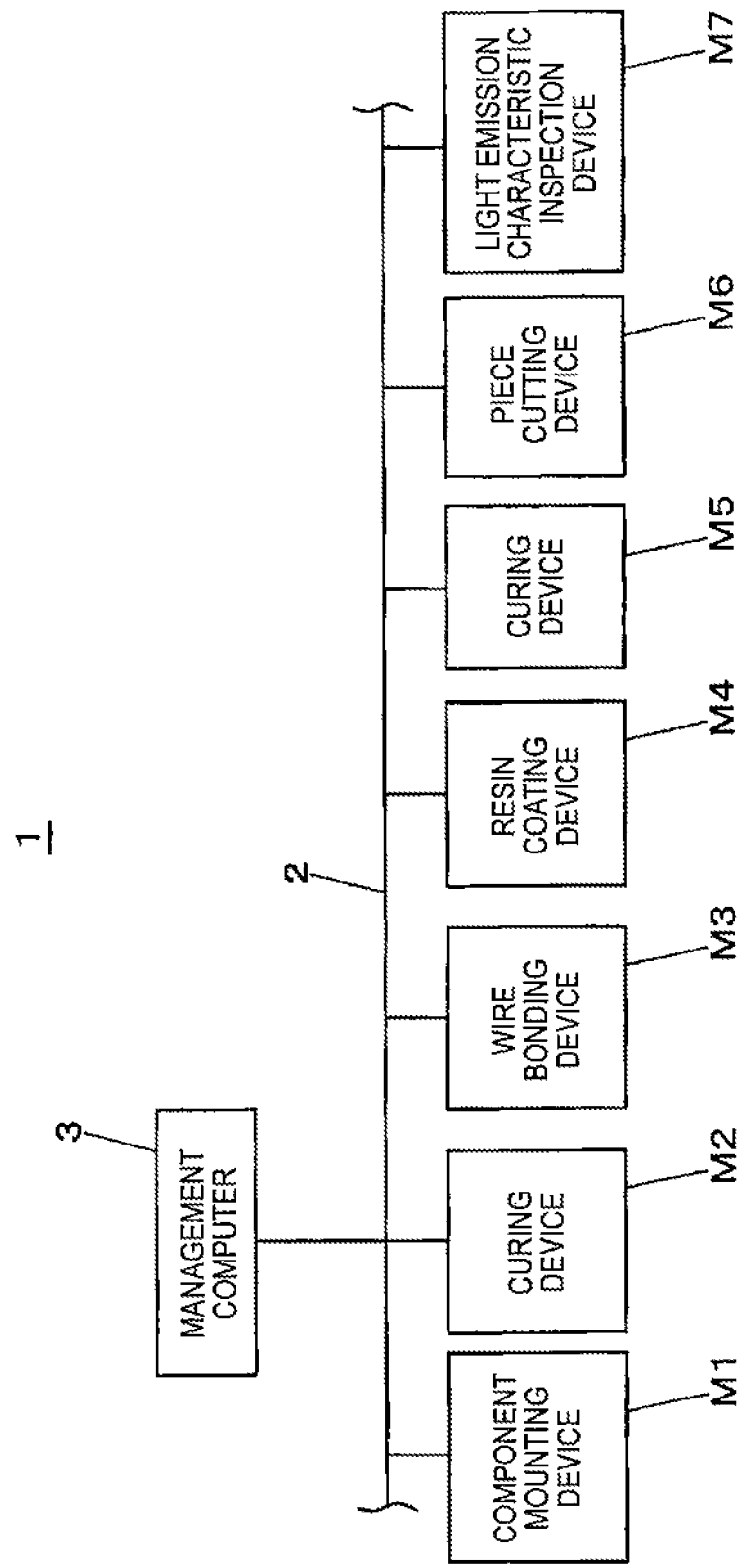
FIG. 1 is a block diagram showing a configuration of an LED package manufacturing system of an embodiment of the present invention.

An embodiment of the present invention is now described by reference to the drawings. First, a configuration of an LED package manufacturing system 1 is described by reference to FIG. 1. The LED package manufacturing system 1 exhibits a function of manufacturing an LED package by covering an LED element mounted on a board with a resin including a fluorescent substance. In the present embodiment, as shown in FIG. 1, a product mounting device M1, a curing device M2, a wire bonding device M3, a resin coating device M4, a curing device M5, a piece cutting device M6, and a light emission characteristic inspection device M7 are connected to each other by means of an LAN system 2. A management computer 3 is configured so as to collectively control the respective devices.

By means of a resin adhesive, the component mounting device M1 bonds and mounts an LED element 5 on a board 4 (see FIG. 2) that is to serve as a base of an LED package. The curing device M2 heats the board 4 mounted with the LED element 5, thereby curing the resin adhesive used in bonding during mounting operation. The wire bonding device M3 connects an electrode of the board 4 to an electrode of the LED element 5 by means of a bonding wire. The resin coating device M4 applies a resin including a fluorescent substance to each of the LED elements 5 on the wire-bonded board 4. The curing device M5 heats the resin-coated board 4, thereby curing the resin applied over the LED element 5. The piece cutting device M6 cuts the resin-cured board 4 for each of the LED elements 5, thereby individually dividing LED packages. The light emission characteristic inspecting device M7 inspects a light emission characteristic, a color tone, with respect to an individually separated, completed LED package. Inspection results are fed back as required.

FIG. 1 illustrates an example layout of a manufacturing line built from serially-arranged devices, including the component mounting device M1 to the light emission characteristic inspection device M7. Adopting such a line layout is not always requisite to the LED package manufacturing system 1. There may also be adopted a layout in which the respective dispersed devices sequentially perform work pertaining to the respective processes, so long as information transmission to be described below is appropriately performed. Further, a plasma processing device that performs plasma processing intended for cleaning electrodes before wire bonding and a plasma processing device that performs plasma processing intended for performing surface modification after wire bonding in order to enhance adhesion of a resin before resin coating can also be placed before or after the wire bonding device M3.

Figure 2:
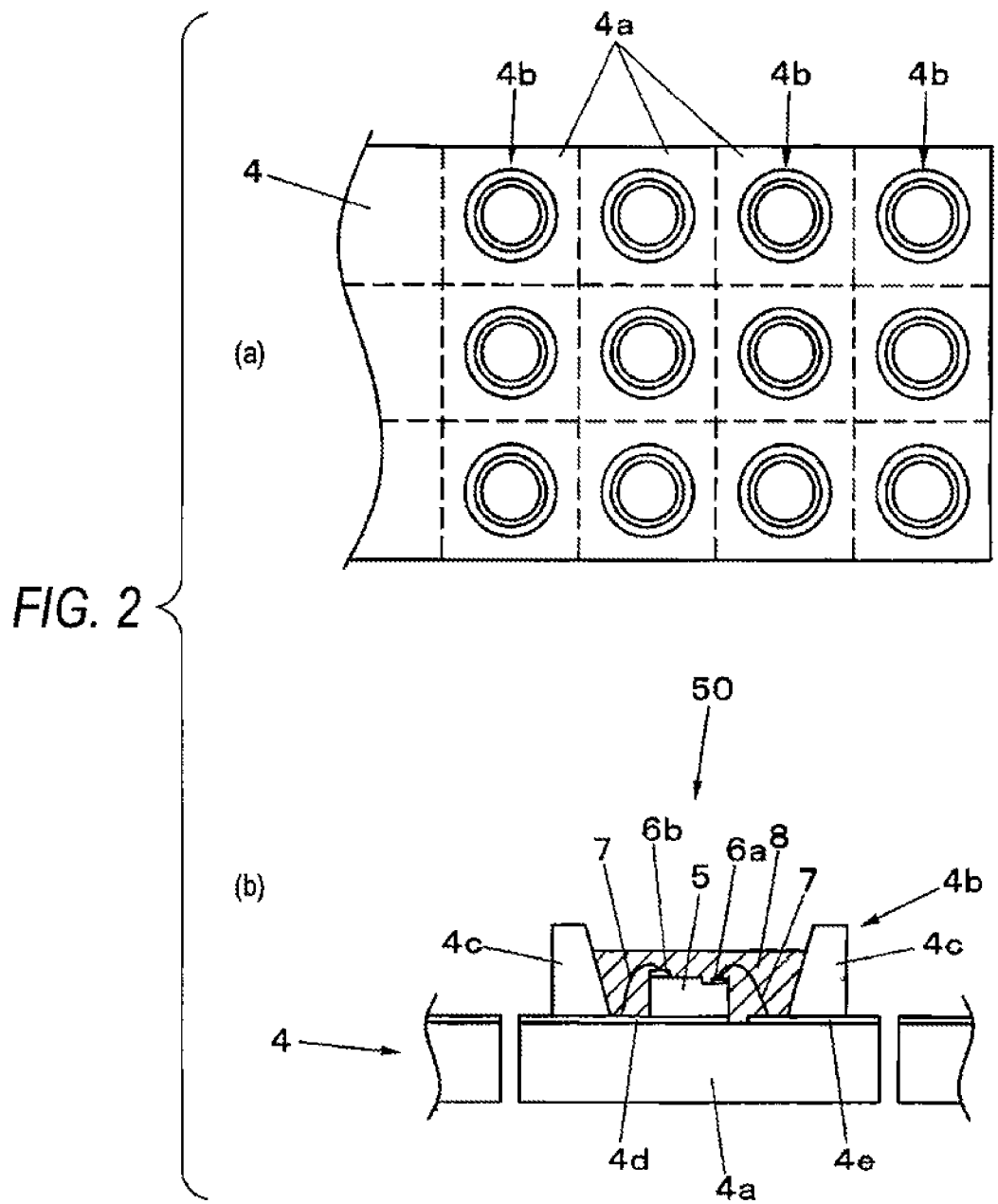
FIGS. 2 (a) and (b) are explanatory views of a configuration of an LED package manufactured by the LED package manufacturing system of the embodiment of the present invention.
Figure 3:
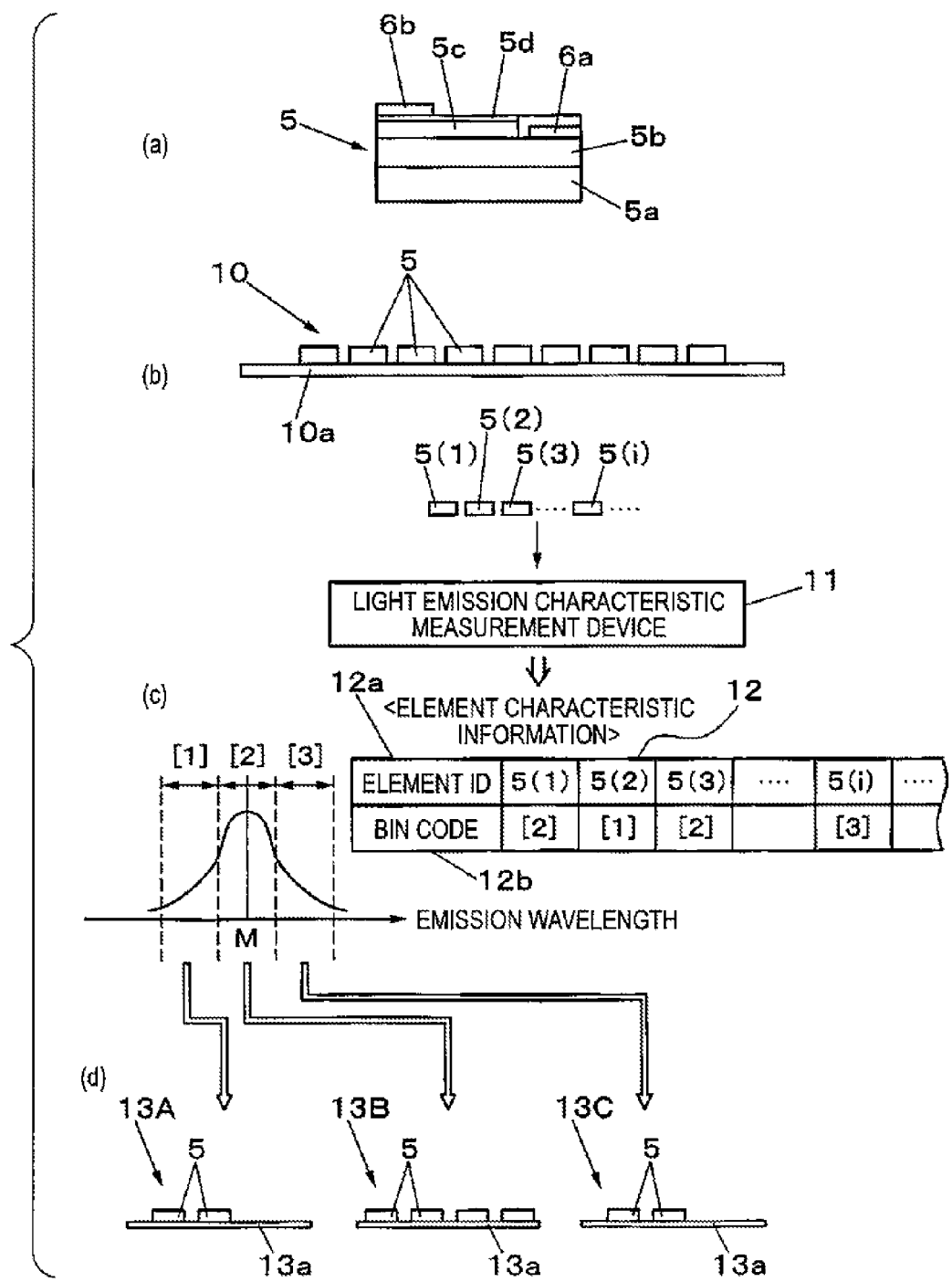
FIGS. 3 (a), (b), (c), and (d) are explanatory views pertaining to a mode for feeding an LED element employed in the LED package manufacturing system of the embodiment of the present invention and element characteristic information about the LED element.

The board 4 and the LED element 5 that are targets of processing performed by the LED package manufacturing system 1 and an LED package 50 that is a completed product are now described by reference to FIGS. 2 and 3. As shown in FIG. 2(a), the board 4 is a multiple-piece board including a plurality of individual boards 4a that will become a base of one LED package 50 when completed as a product. One LED mounting region 4b on which the LED element 5 is to be mounted is formed in each of the individual boards 4a. The LED element 5 is mounted in the LED mounting region 4b in each of the individual boards 4a, and a resin 8 is subsequently applied to the inside of each of the LED mounting regions 4b while covering the LED elements 5. The board 4 having completed processing pertaining to the process is cut into the individual boards 4a after curing of the resin 8, whereby the LED packages 50 shown in FIG. 2(b) are completed.

Each of the LED packages 50 has a function of emanating incandescent light used for light sources of various illuminating devices. The LED element 5 that is a blue LED is combined with the resin 8 including a fluorescent substance that emits yellow fluorescent light whose color is complementary to a blue color, thereby giving off pseudo incandescent light. As shown in FIG. 2(b), a cavity-like reflection region 4c that forms the LED mounting region 4b and that has; for instance, a circular or an oval annular mound, is provided on each of the individual boards 4a. An N-type electrode 6a and a P-type electrode 6b of the LED element 5 mounted inside the reflection region 4c are connected, respectively, to wiring layers 4e and 4d formed over an upper surface of the individual board 4a by means of bonding wires 7. The resin 8 is applied to the inside of the reflection region 4c to a predetermined thickness while covering the LED element 5. In the course of the blue light from the LED element 5 emanating through the resin 8, the blue light is mixed with a yellow color originating from the fluorescent substance contained in the resin 8, whereupon the light is given off as incandescent light.

As shown in FIG. 3(a), the LED element 5 is fabricated by means of layering an N-type semiconductor 5b and a P-type semiconductor 5c on a sapphire board 5a and covering a surface of the P-type semiconductor 5c with a transparent electrode 5d. The N-type electrode 6a and the P-type electrode 6b for connection with the outside are fabricated on the N-type semiconductor 5b and the P-type semiconductor 5c, respectively. As shown in FIG. 3(b), after having been collectively fabricated, a plurality of LED elements 5 are taken out, while remaining separated into pieces, from an LED wafer 10 stuck to and retained by a retaining sheet 10a. The LED elements 5 separated from the wafer into pieces are inevitably susceptible to variations in light emission characteristic, such as an emission wavelength, due to various error factors in the manufacturing process; for instance, unevenness in composition achieved during formation of a film in a wafer. If such an LED element 5 is mounted as-is on the board 4, variations will arise in light emission characteristic of the LED package 50 that is a product.

In the present embodiment, with a view toward preventing occurrence of a quality failure due to variations in light emission characteristic, light emission characteristics of the plurality of LED elements 5 fabricated through the same manufacturing process are previously measured, thereby preparing element characteristic information about correspondence between the respective LED elements 5 and data representing the light emission characteristics of the respective LED elements 5. During application of the resin 8, an appropriate amount of resin 8 commensurate with the light emission characteristic of each of the LED elements 5 is applied. In order to apply the appropriate amount of resin 8, resin application information to be described later is previously prepared.

First, the element characteristic information is described. As shown in FIG. 3(c), the LED elements 5 taken out from the LED wafer 10 are given element IDs used for identifying individual LED elements [the individual LED elements 5 are hereunder identified by serial numbers (i) allocated to the LED wafer 10 of interest] and then sequentially loaded into a light emission characteristic measurement device 11. An element ID of another data format; for instance, matrix coordinates representing a layout of the LED element 5 on the LED wafer 10, can also be used without modification, so long as the element ID is information that enables individual identification of the LED element 5. Using the element ID of such a format makes it possible to feed the LED elements 5 still staying on the LED wafer 10 to the component mounting device M1 to be described later.

The light emission characteristic measurement device 11 feeds electric power to each of the LED elements 5 by way of probes, thereby letting the LED elements actually light up. The thus-generated light is subjected to spectroanalysis and measured in connection with predetermined items, such as an emission wavelength and luminous intensity A standard distribution of emission wavelength is previously prepared, as reference data, for the LED element 5 to be measured. Further, a wavelength range corresponding to the standard range for the distribution is divided into a plurality of wavelength bands. The plurality of LED elements 5 that are measurement targets are ranked according to an emission wavelength. Bin code [1], Bin code [2], and Bin code [3] are imparted in sequence from a low wavelength so as to correspond to the respective ranks set by dividing the wavelength range into three categories. There is prepared element characteristic information 12 having a data configuration that lets element ID 12a correspond to Bin code 12b.

The element characteristic information 12 is one obtained by previously, individually measuring light emission characteristics including emission wavelengths of the plurality of LED elements 5. The information is previously prepared by an LED element manufacturer and transmitted to the LED package manufacturing system 1. A mode of transmission of the element characteristic information 12 can include transmitting the element characteristic information recorded in a single storage medium or transmitting the element characteristic information to the management computer 3 by way of the LAN system 2. In any event, the thus-transmitted element characteristic information 12 is stored in the management computer 3 and offered to the component mounting device M1 as necessary.

As shown in FIG. 3(d), the plurality of LED elements 5 having finished undergoing emission characteristic measurement as mentioned above are sorted according to a characteristic rank and divided according to the characteristic ranks and classified into three types according to ranks of their characteristics. The thus-classified LED elements are individually bonded to three adhesive sheets 13a, respectively. Thereby, there are prepared three types of LED sheets 13A, 13B, and 13C that adhesively hold on respective adhesive sheets 13a the LED elements 5 corresponding to Bin codes [1], [2], and [3]. When the LED elements 5 are mounted on the respective individual boards 4a of the board 4, the LED elements 5 are fed in the form of the thus-ranked LED sheets 13A. 13B, and 13C to the component mounting device M1. The element characteristic information 12 is provided from the management computer 3 so as to indicate which Bin codes [1], [2], and [3] correspond to the LED elements 5 held by the respective LED sheets 13A, 13B, and 13C.

Resin coating information previously prepared in correspondence with the element characteristic information 12 is now described by reference to FIG. 4. The LED package 50 configured so as to produce incandescent light by combination of the blue LED with a YAG-based fluorescent substance performs additive color mixing of the blue light emitted from the LED element 5 with yellow light caused as a result of the fluorescent substance being excited by the blue light. Accordingly, an amount of fluorescent substance particles contained in the indented LED mounting region 4b where the LED element 5 is to be mounted becomes a factor critical to assuring a specified light emission characteristic of the product LED package 50.

As mentioned above, variations classified by the Bin codes [1], [2], and [3] exist in the emission wavelengths of the plurality of LED elements 5 that simultaneously become work targets. Therefore, an appropriate amount of fluorescent particles in the resin 8 that is applied so as to cover the LED element 5 varies according to the Bin codes [1], [2], and [3]. As shown in FIG. 4, the resin coating information 14 prepared in the present embodiment previously specifies, in nl (nano-liters), an appropriate amount of resin 8 to be applied, which is prepared by letting silicone resin or an epoxy resin include YAG-based fluorescent particles, according to Bin code classification 17.

As provided in a fluorescent substance density field 16, a fluorescent substance density showing a density of fluorescent particles in the resin 8 is set in a plurality of ways (three densities D1, D2, and D3). Further, according to the density of fluorescent substance in the resin 8 to be used, a different numeral is used for the appropriate amount of resin 8 to be applied. Thus, the reason why a different amount of resin applied is set according to the density of fluorescent substance is that applying the resin 8 including an appropriate amount of fluorescent substance according to a degree of variations in emission wavelength is more preferable in light of securement of quality. For instance, when the LED element 5 whose Bin code classification 17 is [2] is taken as a target, it is desirable to set an appropriate amount of resin in such a way that v22 nl of the resin 8 having a fluorescent substance density D2 is to be discharged. As a matter of course, when the resin 8 having a density of single fluorescent substance is used for certain reasons, an appropriate amount of resin to be discharged, which is commensurate with the Bin code classification 17 at the density of fluorescent substance, is selected.

A configuration and a function of the component mounting device M1 is now described by reference to FIG. 5. As shown in a plan view of FIG. 5(*a*), the component mounting device M1 has a board transport mechanism 21 that transports the board 4, which is a work target and which is fed from upstream, in a board transport direction (designated by arrow "a"). An adhesive application section A shown as cross section A-A in FIG. 5(*b*) and a component mounting section B shown as cross section B-B in FIG. 5(*c*) are disposed in this sequence from upstream in the board transport mechanism 21. An adhesive application section A has an adhesive feed section 22 that is disposed beside the board transport mechanism 21 and that feeds a resin adhesive 23 in the form of a coating film having a predetermined thickness and an adhesive transfer mechanism 24 that is movable in a horizontal direction (designated by arrow "b") above the board transport mechanism 21 and the adhesive feed section 22. The component mounting section B has a component feed mechanism 25 that is disposed beside the board transport mechanism 21 and that holds the LED sheets 13A, 13B, and 13C shown in FIG. 3(*d*) and a component mounting mechanism 26 that is movable in the horizontal direction (designated by arrow "c") above the board transport mechanism 21 and the component feed mechanism 25.

Figure 5:
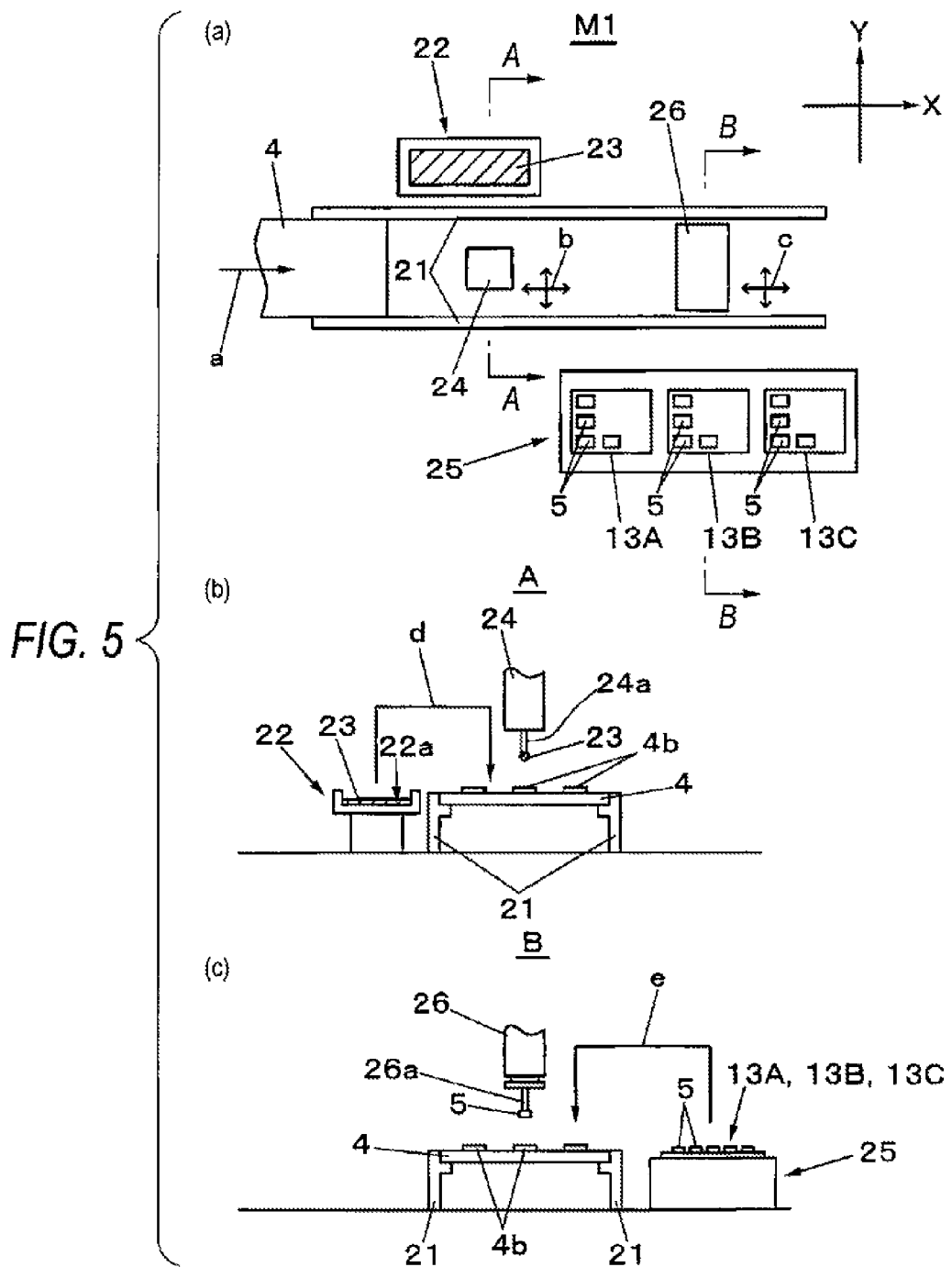
FIGS. 5 (a), (b), and (c) are explanatory views of a configuration and a function of a component mounting device in the LED package manufacturing system of the embodiment of the present invention.

As shown in FIG. 5(*b*), the board 4 carried by the board transport mechanism 21 is positioned at the adhesive application section A. The resin adhesive 23 is applied to the LED mounting regions 4*b* formed in the respective individual boards 4*a*. Specifically, the adhesive transfer mechanism 24 is first moved to an elevated position above the adhesive feed section 22, and a transfer pin 24*a* is brought into contact with a coating film of the resin adhesive 23 formed over a transfer surface 22*a*, thereby letting the resin adhesive 23 adhere to the coating film. The adhesive transfer mechanism 24 is then moved to an elevated position above the board 4, and the transfer pin 24*a* is lowered to the LED mounting region 4*b* (designated by "arrow d"), thereby feeding the resin adhesive 23 adhering to the transfer pin 24*a* to an element mounting position in each of the LED mounting regions 4*b* through transfer.

The board 4 having finished undergoing application of the adhesive is transported downstream and positioned at the component mounting section B as shown in FIG. 5(*c*). The LED element 5 is mounted on each of the LED mounting regions 4*b* having finished being fed with the adhesive. Specifically, the component mounting mechanism 26 is first moved to an elevated position above the component feed mechanism 25. A mount nozzle 26*a* is lowered to any one of the LED sheets 13A, 13B, and 13C held by the component feed mechanism 25, and the mount nozzle 26*a* holds and picks up the LED element 5. The component mounting mechanism 26 is moved to an elevated position above any of the LED mounting regions 4*b* on the board 4, and the mount nozzle 26*a* is lowered (designated by arrow "e"). The LED element 5 held by the mount nozzle 26*a* is mounted to an adhesive-coated element mounting position in the LED mounting region 4*b*.

When the component mounting device M1 mounts the LED elements 5 on the board 4, component mounting operation is performed according to a previously prepared element mounting program. The element mounting program has a previously-set sequence for taking the LED elements 5 out of any of the LED sheets 13A, 13B, and 13C by means of individual mounting operation performed by the component mounting mechanism 26 and mounting the thus picked LED elements 5 on the plurality of individual boards 4*a* of the board 4.

Figure 9:
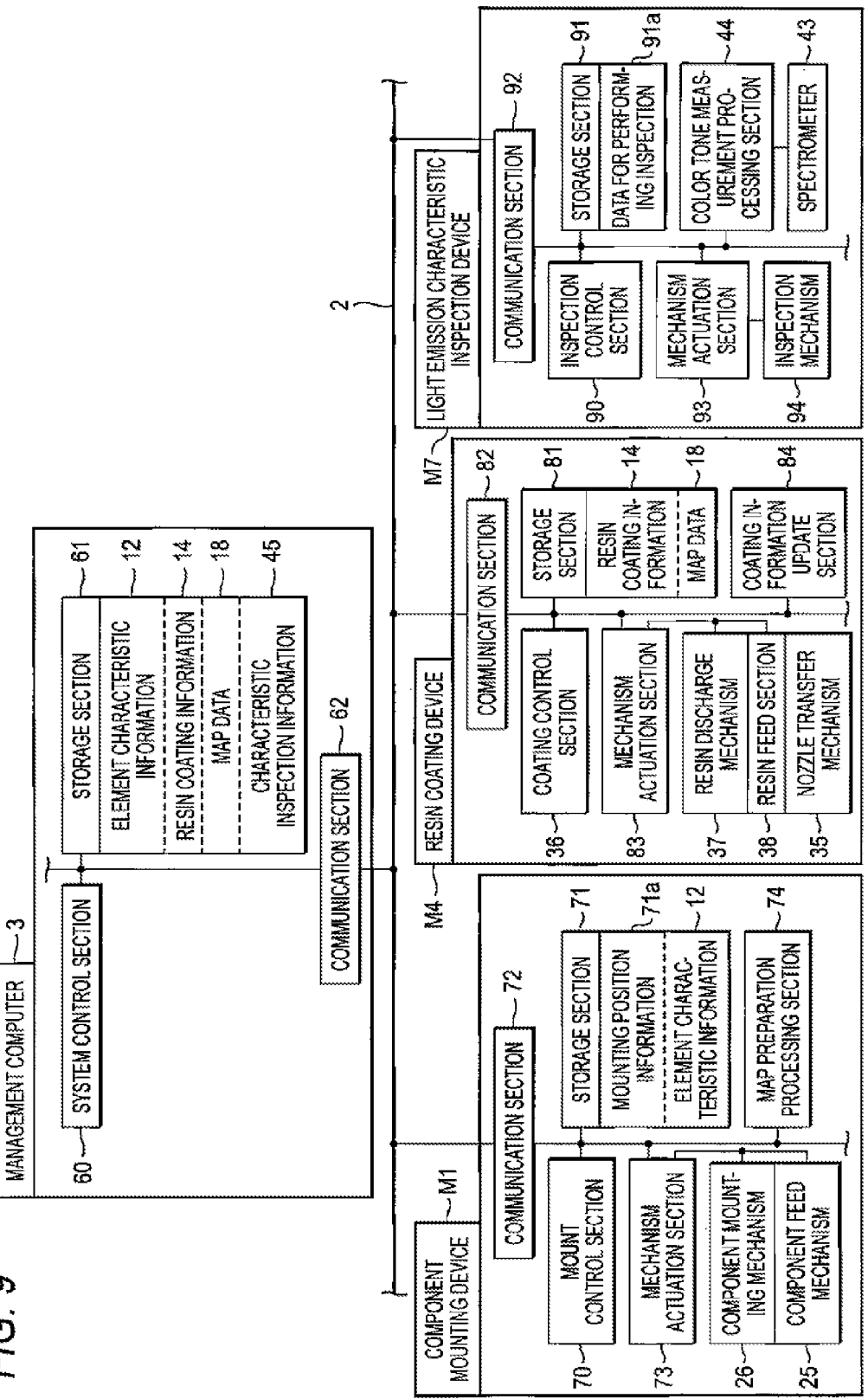
FIG. 9 is a block diagram showing a configuration of a control system of the LED package manufacturing system of the embodiment of the present invention.

On the occasion of performance of component mounting operation, mounting position information 71*a* (see FIG. 9) showing on which one of the plurality of individual boards 4*a* of the board 4 the individual LED element 5 has been mounted is extracted from work execution history and recorded. A map preparation processing section 74 (see. FIG. 9) prepares, as map data 18 shown in FIG. 6, data that establish a correlation between the mounting position information 71*a* and the element characteristic information 12 showing which one of the characteristic ranks (the Bin code [1], [2], and [3]) corresponds to the LED element 5 mounted on the individual mounting board 4*a*.

Figure 6:
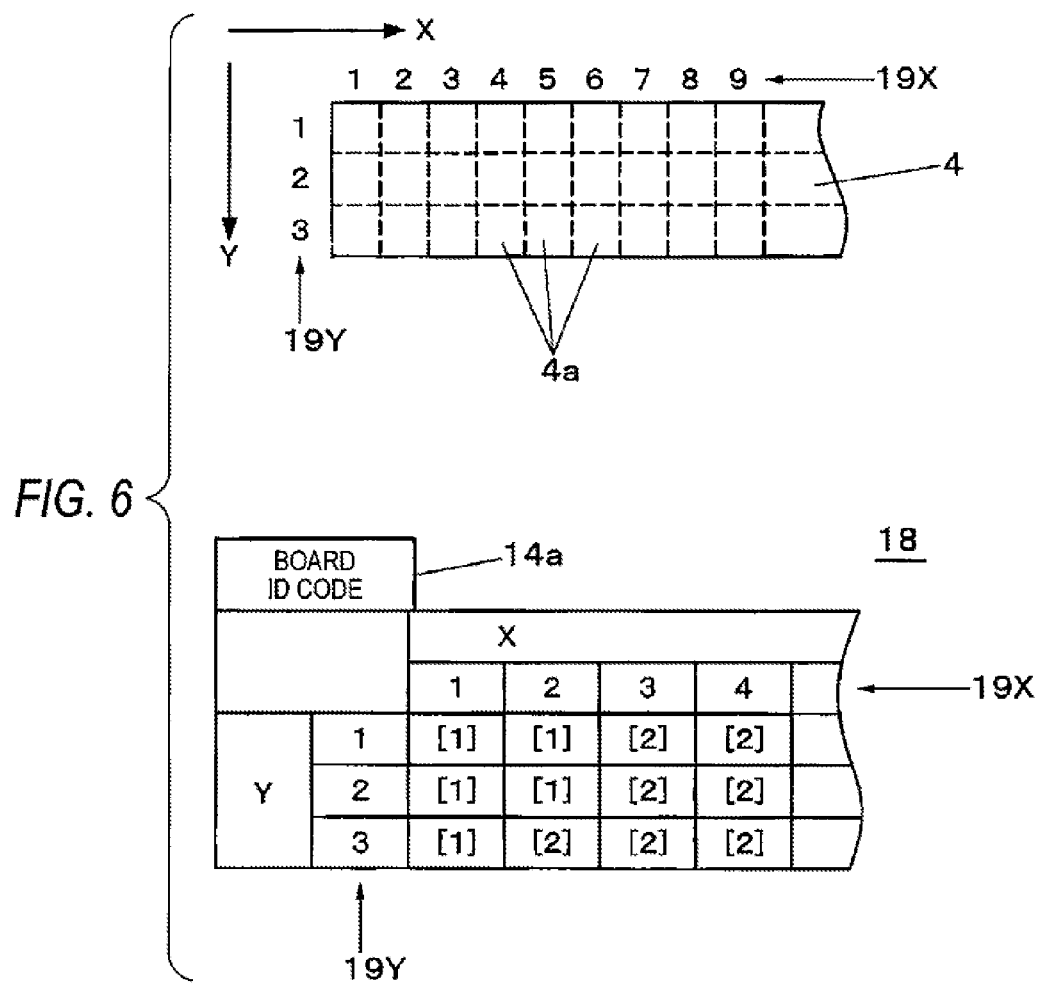
FIG. 6 is an explanatory view of map data used in the LED package manufacturing system of the embodiment of the present invention.

In FIG. 6, a position of each of the plurality of individual boards 4*a* of the board 4 is specified by combination of matrix coordinates 19X and 19Y that respectively designate a position in a direction X and a position in a direction Y. A Bin code to which the LED element 5 mounted at the position pertains is caused to correspond to an individual cell of a matrix determined by the matrix coordinates 19X and 19Y. There are thereby prepared the map data 18 that provide a correlation between the mounting position information 71*a* showing the position on the board 4 where the LED element 5 has been mounted by the component mounting device M1 and the element characteristic information 12 about the LED element 5.

Specifically, the component mounting device M1 has the map preparation processing section 74, as map data preparation unit, which prepares for each of the boards 4 the map data 18 that provide a correlation between the mounting position information 71*a* showing the position on the board 4 where the LED element 5 has been mounted by the component mounting device M1 and the element characteristic information 12 about the LED element 5. The thus prepared map data 18 are transmitted as feed forward data to the resin coating device M4 to be described below, by way of the LAN system 2.

Figure 7:
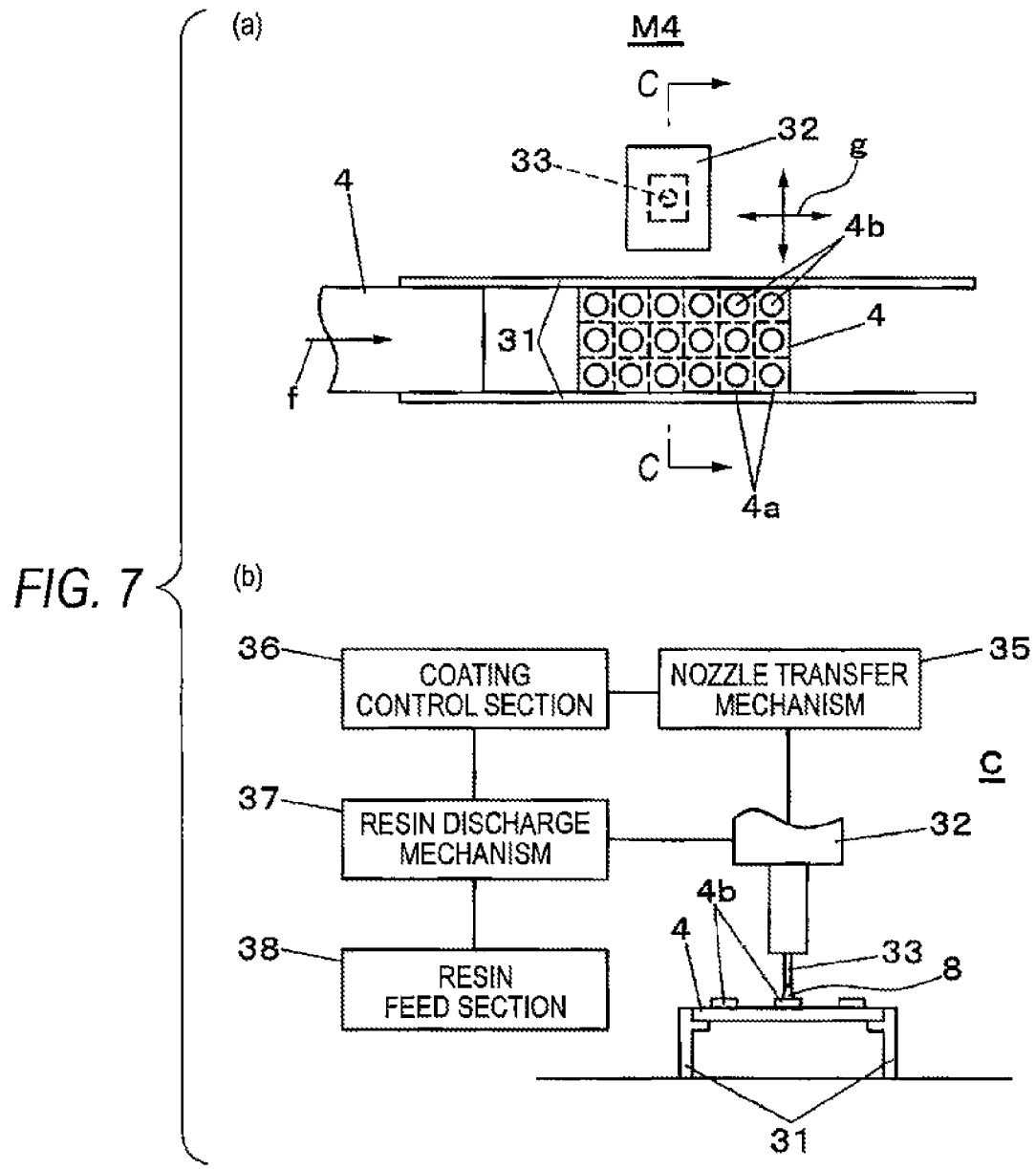
FIGS. 7 (a) and (b) are explanatory views of a configuration and a function of a resin coating device in the LED package manufacturing system of the embodiment of the present invention.

A configuration and a function of the resin coating device M4 are now descried by reference to FIG. 7. The resin coating device M4 has a function of applying the resin 8 so as to cover the plurality of LED elements 5 mounted on the board 4 by the component mounting device M1. As shown in a plan view of FIG. 7(*a*), the resin coating device M4 is configured in such a way that a board transport mechanism 31 for transporting the board 4, which has been fed from the upstream location and which is a work target, in a board transport direction (designated by arrow "f") is equipped with a resin coating section C shown as C-C cross section in FIG. 7(*b*). A resin discharge head 32 having at its lower end a discharge nozzle 33 for emitting the resin 8 is disposed in the resin coating section C.

As shown in FIG. 7(*b*), the resin discharge head 32 is moved by a nozzle transfer mechanism 35, performing horizontal movements (designated by arrow "g" shown in FIG. 7(*a*)) and vertical movements with respect to the board 4 transported by the board transport mechanism 31. Therefore, the nozzle transfer mechanism 35 is a relative transfer mechanism that moves the discharge nozzle 33 relatively to the board 4. The resin coating device M4 has a resin feed section 38 for feeding the resin 8 and a resin discharge mechanism 37 for discharging the resin 8 fed by the resin feed section 38 from the discharge nozzle 33. The resin feed section 38 can also be configured so as to store a plurality of types of resins 8 previously having different densities of fluorescent substance according to densities of a plurality of types of fluorescent substances specified by the resin coating information 14. Alternatively, the resin feed section 38 can also be configured so as to have a compounding mechanism capable of automatically controlling a density of fluorescent substance and automatically prepare the resin 8 having a density of fluorescent substance specified by the resin coating information 14.

The nozzle transfer mechanism 35 and the resin feed section 38 are controlled by the coating control section 36, whereby the discharge nozzle 33 can discharge the resin 8 to arbitrary LED mounting regions 4b formed in the plurality of respective individual boards 4a of the board 4. During resin discharge operation, the coating control section 36 controls the resin discharge mechanism 37, thereby regulating an amount of resin 8 discharged from the discharge nozzle 33 to a desired application amount in accordance with the light emission characteristic of the LED element 5 mounted on each of the LED mounting regions 4b.

Specifically, a coating control section 36 controls the resin discharge mechanism 37 and the nozzle transfer mechanism 35, which is a relative transfer mechanism, on the basis of the map data 18 transmitted from the component mounting device M1 and the previously stored resin coating information 14. The amount of resin 8 to be applied, which is appropriate for exhibiting a specified light emission characteristic, can thereby be discharged from the discharge nozzle 33, to thus coat each of the LED elements 5 with the resin. As will be described later, a coating information update section 84 (see FIG. 9) is to constantly update the resin coating information 14 on the basis of a feedback result of a light emission characteristic inspection performed by the light emission characteristic inspection device M7 in a subsequent process. History data pertaining to coating operation performed as a result of the coating control section 36 controlling the resin discharge mechanism 37 and the nozzle transfer mechanism 35 on the basis of the map data 18 and the resin coating information 14 are stored in a storage section 81 (see FIG. 9) as history data showing a manufacturing history of the LED package 50. The management computer 3 reads the history data when necessary.

Specifically, the resin coating device M4 has a function of coating, on the basis of the map data 18 and the resin coating information 14, the respective LED elements 5 mounted on the board 4 with the amounts of resin 8 to be applied appropriate for exhibiting the specified light emission characteristic. The resin coating device M4 additionally has the coating information update section 84 as coating information update unit for updating the resin coating information 14. Although FIG. 7 shows an example of the resin discharge head 32 equipped with the single discharge nozzle 33, the resin discharge head 32 can also have a plurality of discharge nozzles 33 and simultaneously apply the resin 8 to a plurality of targets, or a plurality of LED mounting regions 4b. In this case, the resin discharge mechanism 37 individually controls the amount of application for each of the discharge nozzles 33.

Figure 8:
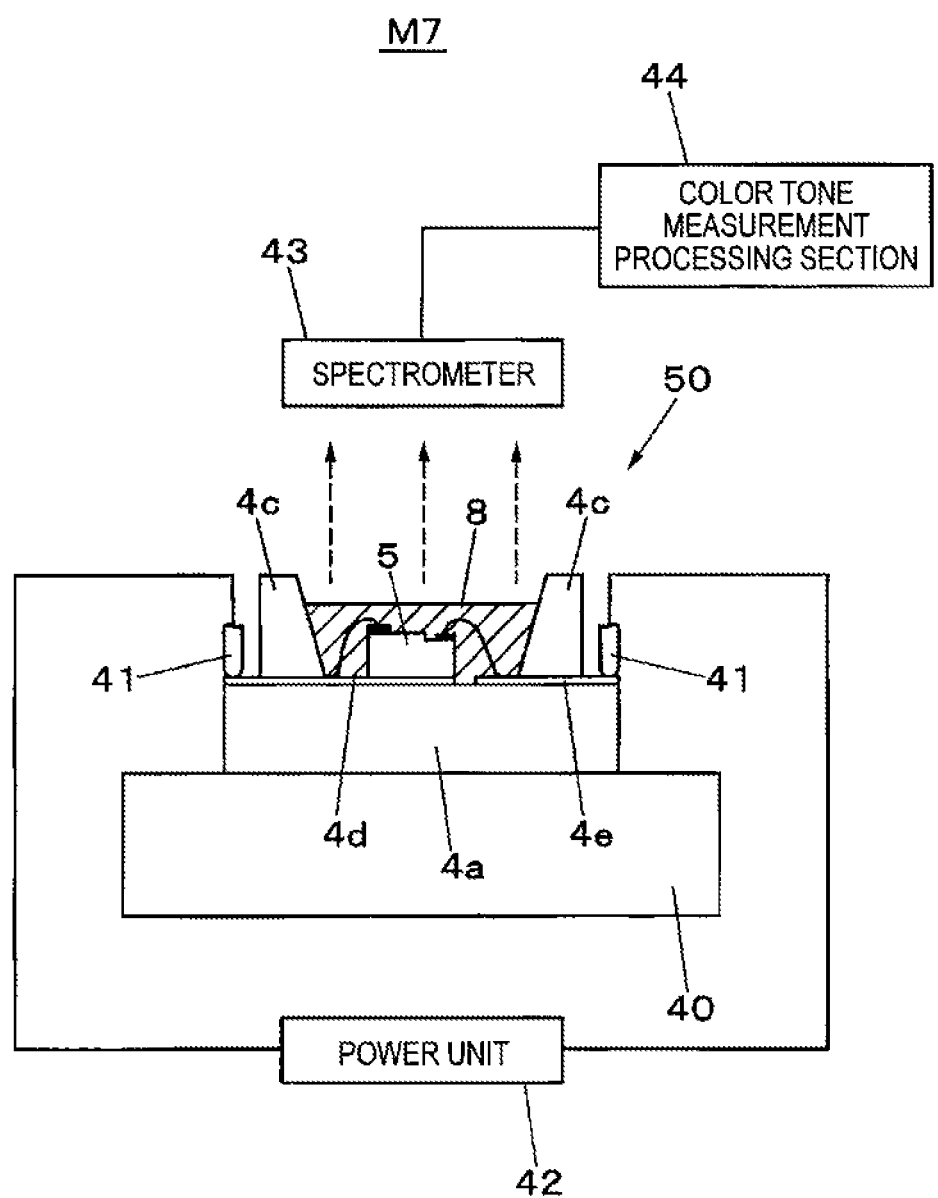
FIG. 8 is an explanatory view showing a configuration of a light emission characteristic inspection device in the LED package manufacturing system of the embodiment of the present invention.

By reference to FIG. 8, a configuration of the light emission characteristic inspection device M7 is now described. The light emission characteristic inspection device M7 has a function of performing an inspection as to whether or not each of the LED packages 50 completed by separating the board 4 into the individual boards 4a after curing of the resin 8 has the specific light emission characteristic on a per-piece basis. As shown in FIG. 8, the LED packages 50 to be inspected are placed on a holding table 40 provided in a dark chamber (omitted from the drawing) in the light emission characteristic inspection device M7, and an inspection probe 41 remains in contact with wiring layers 4e and 4d connected to the LED element 5 in the LED package 50. The probe 41 is connected to a power unit 42. Electric power for lighting purpose is fed to the LED elements 5 by activation of the power unit 42, whereby the LED elements 5 emit blue light. In the course of the blue light passing through the resin 8, incandescent light resulting from additive color mixing of the yellow light emanated as a result of excitation of the fluorescent substance in the resin 8 with the blue light is emanated upwards from the respective LED packages 50.

A spectrometer 43 is placed at an elevated position above the holding table 40, and the incandescent light emanated from the LED package 50 is received by the spectrometer 43. A color tone measurement processing section 44 analyzes the thus-received incandescent light. Inspection is here carried out in connection with the light emission characteristics, such as a color tone rank and a luminous flux of incandescent light, and a deviation from the specified light emission characteristic is detected as an inspection result. The detection result yielded by inspection is fed back to the resin coating device M4. When the deviation exceeds the preset allowance range, the resin coating device M4 received the feedback performs processing for updating the resin coating information 14 on the basis of the inspection result. Subsequently, resin is applied to the board 4 on the basis of newly updated resin coating information 14.

By reference to FIG. 9, a configuration of a control system of the LED package manufacturing system 1 is now described. There are illustrated the management computer 3, the component mounting device M1, and the resin coating device M4 among the constituent elements of the devices making up the LED package manufacturing system 1 and also constituent elements relevant to transmission, reception, and updating of the element characteristic information 12, the resin coating information 14 and the map data 18 in the light emission characteristic inspection device M7.

In FIG. 9, the management computer 3 has a system control section 60, a storage section 61, and a communication section 62. The system control section 60 performs centralized control of LED package manufacturing operation performed by the LED package manufacturing system 1. The storage section 61 stores the element characteristic information 12, the resin coating information 14, the map data 18 as necessary, and characteristic inspection information 45 to be described later, as well as storing a program and data necessary for control processing effected by the system control section 60. The communication section 62 is connected to another device by way of the LAN system 2 and exchanging a control signal and data with the device. The element characteristic information 12 and the resin coating information 14 are transmitted from the outside and stored in the storage section 61 by way of the LAN system 2 and the communication section 62 or by way of CD-ROM and a single storage medium.

The component mounting device M1 has a mount control section 70, a storage section 71, a communication section 72, a mechanism actuation section 73, and a map preparation processing section 74. In order to perform component mounting operation to be effected by the component mounting device M1, the mount control section 70 controls respective sections to be described below on the basis of various programs and data stored in the storage section 71. In addition to storing a program and data required to execute control processing performed by the mount control section 70, the storage section 71 stores the mounting position information 71a and the element characteristic information 12. The mounting position information 71a is generated from execution history data pertaining to mount operation control performed by the mount control section 70. The element characteristic information 12 is transmitted from the management computer 3 by way of the LAN system 2. The communication section 72 is connected to another device by way of the LAN system 2 and exchanges a control signal and data with the device.

The mechanism actuation section 73 is controlled by the mount control section 70 and actuates the component feed mechanism 25 and the component mounting mechanism 26. The LED elements 5 are thereby mounted on the respective individual boards 4a of the board 4. The map preparation processing section 74 (map data preparation unit) performs processing for preparing, for each of the boards 4, the mounting position information 71a that shows positions of the LED elements 5 on the board 4 mounted by the component mounting device M1 and that is stored in the storage section 71 and the map data 18 associated with the element characteristic information 12 in relation to each of the LED elements 5. Specifically, the map data preparation unit is provided in the component mounting device M1, and the map data 18 can also be transmitted from the component mounting device M1 to the resin coating device M4. Incidentally, the map data 18 can be transmitted from the component mounting device M1 to the resin coating device M4 by way of the management computer 3. In this case, as shown in FIG. 9, the map data 18 are stored in the storage section 61 of the management computer 3 as well.

The resin coating device M4 has the coating control section 36, the storage section 81, a communication section 82, a mechanism actuation section 83, and the coating information update section 84. In order to effect resin coating operation to be performed by the resin coating device M4, the coating control section 36 controls respective sections to be described below on the basis of various programs and data stored in the storage section 81. In addition to storing a program and data necessary to perform control processing of the coating control section 36, the storage section 81 stores the resin coating information 14 and the map data 18. The resin coating information 14 is transmitted from the management computer 3 by way of the LAN system 2, and the map data 18 are likewise transmitted from the component mounting device M1 by way of the LAN system 2. The communication section 82 is connected to another device by way of the LAN system 2 and exchanges a control signal and data with the device.

The mechanism actuation section 83 is controlled by the coating control section 36 and actuates the resin discharge mechanism 37, the resin feed section 38, and the nozzle transfer mechanism 35. The resin 8 is thereby applied so as to cover the LED elements 5 mounted on the respective individual boards 4a of the board 4. On the basis of the inspection result fed back from the light emission characteristic inspection device M7, the coating information update section 84 performs processing for updating the resin coating information 14 stored in the storage section 81.

The light emission characteristic inspection device M7 has an inspection control section 90, a storage section 91, a communication section 92, a mechanism actuation section 93, and an inspection mechanism 94. In order to carry out inspection operation to be performed by the light emission characteristic inspection device M7, the inspection control section 90 controls respective sections to be described below, on the basis of inspection performance data 91a stored in the storage section 91. The communication section 92 is connected to another device by way of the LAN system 2 and exchanges a control signal and data with the device. The mechanism actuation section 93 actuates the inspection mechanism 94 having a work transferring/holding function for handling the LED packages 50 to perform inspection operation.

The color tone measurement section 44 is controlled by the inspection control section 90 and performs light emission characteristic inspection for measuring a color tone of the incandescent light from the LED package 50 received by the spectrometer 43. The inspection result is transmitted through feed back to the resin coating device M4 by way of the LAN system 2. Specifically, the light emission characteristic inspection device M7 has a function of inspecting light emission characteristics of the LED package 50 manufactured by coating the LED element 5 with the resin 8, thereby detecting a deviation from the specified light emission characteristic, and feeding back the inspection result to the resin coating device M4.

In relation to the configuration shown in FIG. 9, processing functions other than the functions required to perform working operations unique to the respective devices; for instance, the function of the map preparation processing section 74 provided in the component mounting device M1 and the function of the coating information update section 84 provided in the resin coating device M4, are not necessarily attached as adjuncts to the respective devices. For example, the configuration can also be implemented in such a way that the function of the map preparation processing section 74 and the function of the coating information update section 84 are covered by an arithmetic processing function of the system control section 60 of the management computer 3 and that exchange of a necessary signal is performed by way of the LAN system 2.

In the configuration of the LED package manufacturing system 1, the component mounting device M1, the resin coating device M4, and the light emission characteristic inspection device M7 are all connected to the LAN system 2. The management computer 3 that stores the element characteristic information 12 in the storage section 61 and the LAN system 2 act together as element characteristic information providing unit that provides the component mounting device M1 with, as the element characteristic information 12, information acquired by previously, individually measuring light emission characteristics including light emission wavelengths of the plurality of LED elements 5. Likewise, the management computer 3 that stores the resin coating information 14 in the storage section 61 and the LAN system 2 act together as resin information providing unit that provides the resin coating device M4, as resin coating information, with information about correspondence between an amount of resin 8 to be applied appropriate for acquiring an LED package 50 having a specified light emission characteristic and element characteristic information.

Specifically, the element characteristic information providing unit for providing the component mounting device M1 with the element characteristic information 12 and the resin information providing unit for providing the resin coating device M4 with the resin coating information 14 are configured so as to transmit the element characteristic information and the resin coating information read from the storage section 61 of the management computer 3, which is external storage unit, respectively to the component mounting device M1 and the resin coating device M4 by way of the LAN system 2. The light emission characteristic inspection device M7 is configured so as to transmit an inspection result as the characteristic inspection information 45 (see FIG. 9) to the resin coating device M4 by way of the LAN system 2. The characteristic inspection information 45 can also be transmitted to the resin coating device M4 by way of the management computer 3. In this case, as shown in FIG. 9, the characteristic inspection information 45 is stored in the storage section 61 of the management computer 3 as well.

Figure 10:
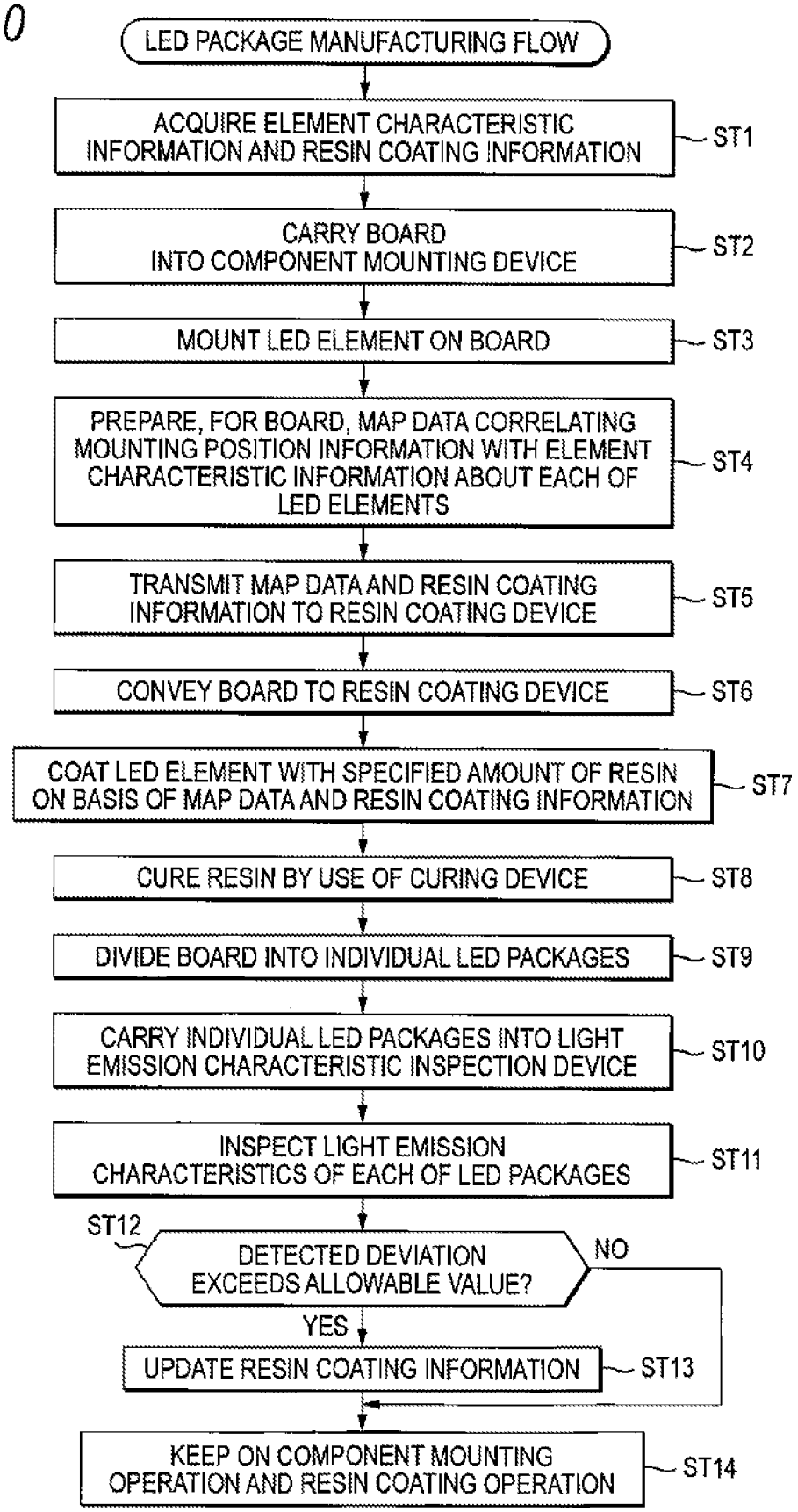
FIG. 10 is a flowchart of LED package manufacturing operation in the LED package manufacturing system of the embodiment of the present invention.

Processing pertaining to the LED package manufacturing process performed by the LED package manufacturing system is now described along a flowchart shown in FIG. 10 and by reference to the drawings. First, the LED package manufacturing system 1 acquires the element characteristic information 12 and the resin coating information 14 (ST1). Specifically, the element characteristic information 12 acquired by previously, individually measuring the light emission characteristics of the plurality of LED elements 5 including their emission wavelengths and the resin coating information 14 about correspondence between the amounts of resin 8 to be applied appropriate for obtaining the LED package 50 exhibiting a specified light emission characteristic and the element characteristic information 12 are acquired from an external device by way of the LAN system 2 or a storage medium.

Figure 11:
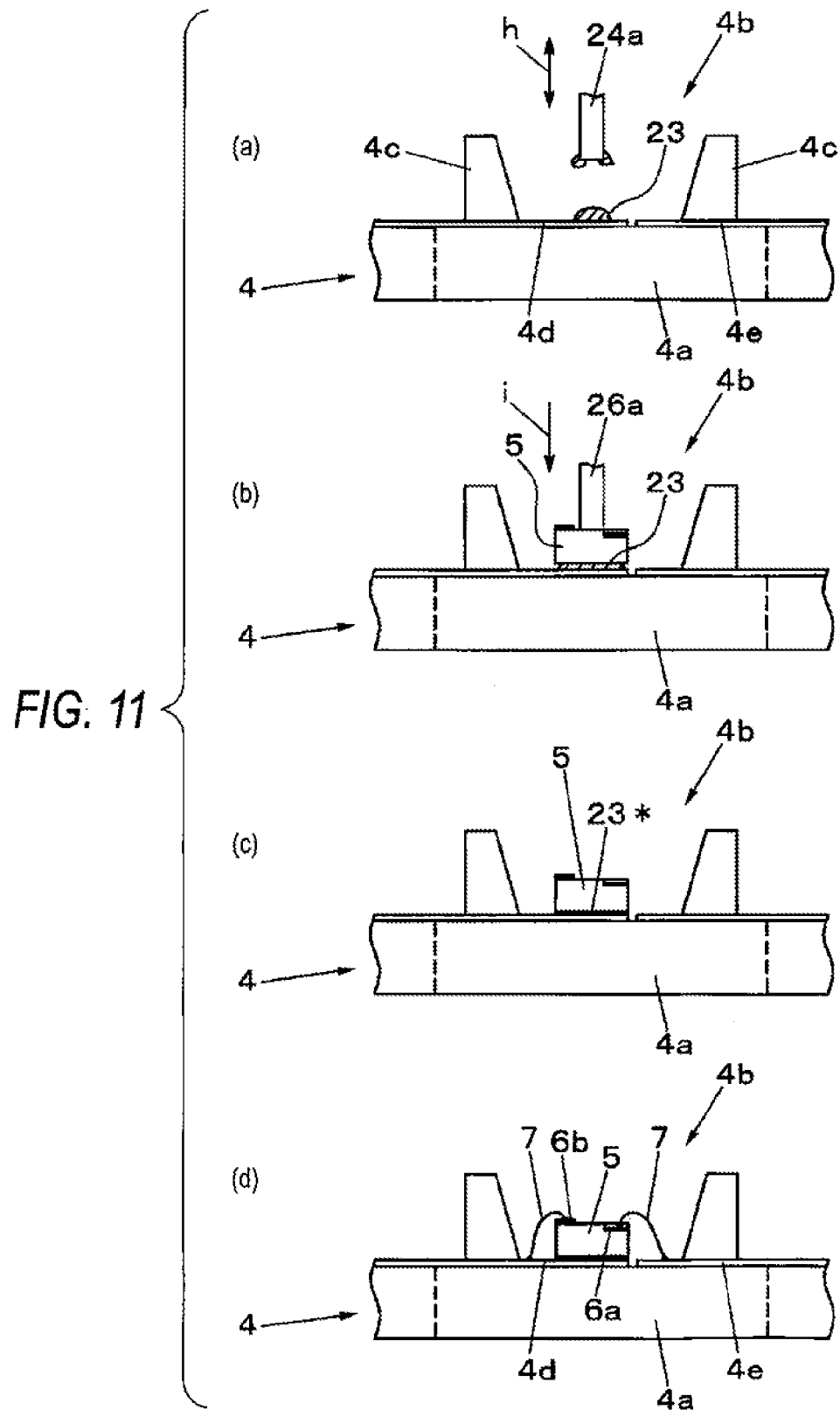
FIGS. 11 (a), (b), (c), and (d) are process explanatory views showing an LED package manufacturing process for the LED package manufacturing system of the embodiment of the present invention.

Subsequently, the board 4 to be a target of mounting is carried in the component mounting device M1 (ST2). As shown in FIG. 11(a), the component mounting device M1 feeds the resin adhesive 23 to the element mounting position in each of the LED mounting regions 4b by means of the transfer pin 24a of the adhesive transfer mechanism 24. Subsequently, as shown in FIG. 11(b), the LED element 5 held by the mount nozzle 26a of the component mounting mechanism 26 is mounted in each of the LED mounting regions 4b of the board 4 by way of the resin adhesive 23 (ST3). The map preparation processing section 74 prepares, from data pertaining to performance of component mounting operation, the map data 18 that correlate the mounting position information 71a with the element characteristic information 12 about each the LED elements 5, with regard to the board 4 (ST4). Next, the map data 18 are transmitted from the component mounting device M1 to the resin coating device M4, and the resin coating information 14 is transmitted from the management computer 3 to the resin coating device M4 (ST5). Resin coating operation to be performed by the resin coating device M4 thereby becomes feasible.

Next, the board 4 on which the components have been mounted is sent to the curing device M2, where the board 4 is heated. As shown in FIG. 11(c), the resin adhesive 23 thereby becomes thermally cured, to thus become a resin adhesive 23*. The LED elements 5 are fixed to the respective individual boards 4a. Subsequently, the resin-cured board 4 is sent to the wire bonding device M3. As shown in FIG. 11(d), the wiring layer 4e of the individual board 4a is connected to the N-type electrode 6a of the LED element 5 by means of the bonding wire 7, and the wiring layer 4d of the same is connected to the P-type electrode 6b of the Led element 5 by means of the bonding wire 7.

Figure 12:
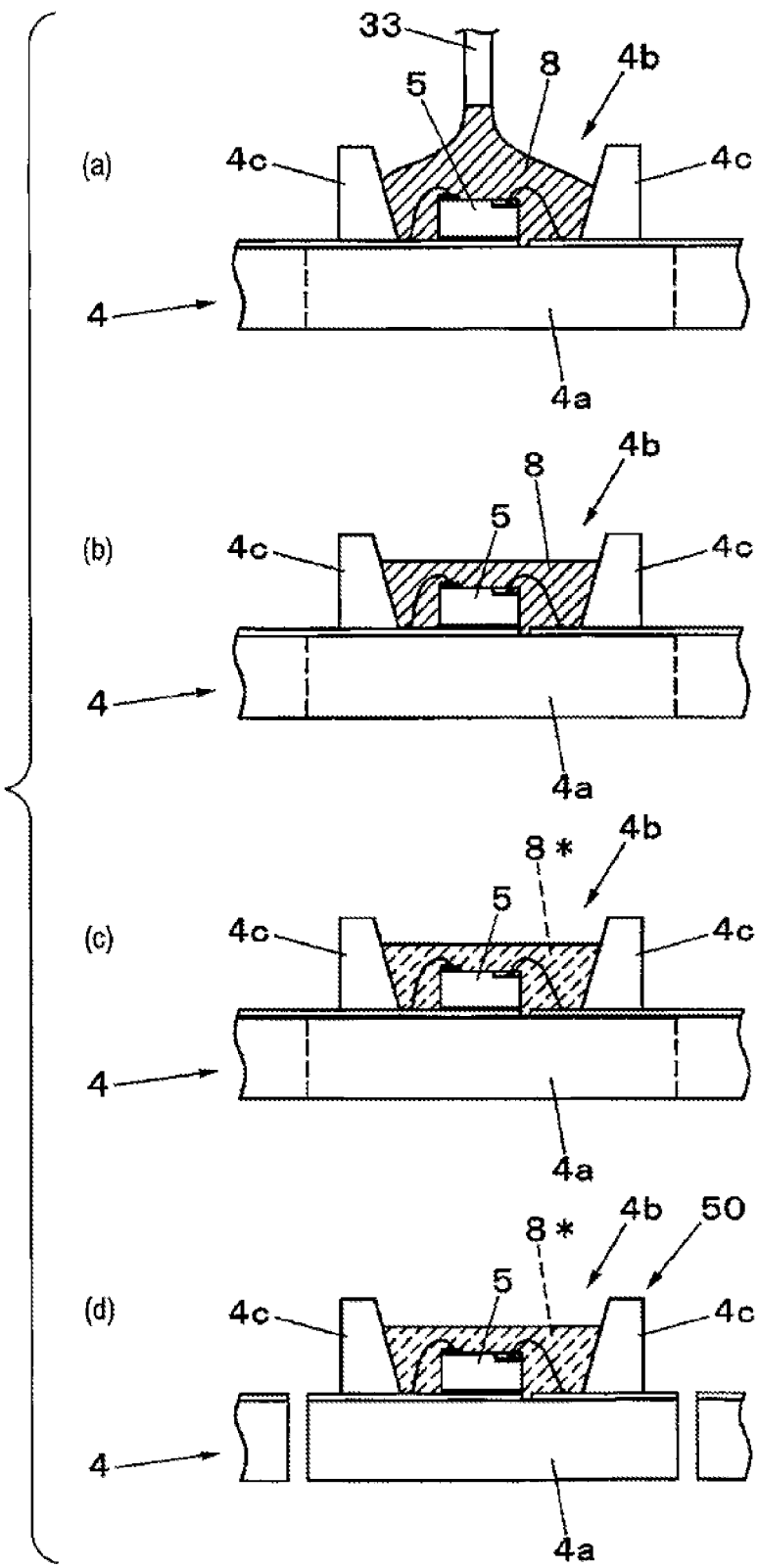
FIGS. 12 (a), (b), (c), and (d) are process explanatory views showing an LED package manufacturing process for the LED package manufacturing system of the embodiment of the present invention.

The board 4 having undergone wire bonding is conveyed to the resin coating device M4 (ST6). As shown in FIG. 12(a), the resin coating device M4 discharges the resin 8 to the interior of each LED mounting regions 4b surrounded by the reflection region 4c from the discharge nozzle 33. The LED element 5 is coated with a specified amount of resin 8 shown in FIG. 12(b) on the basis of the map data 18 and the resin coating information 14 (ST7). Next, the board 4 is sent to the curing device M5, and the resin 8 is cured when heated by the curing device M5 (ST8). As shown in FIG. 12(c), the resin 8 applied so as to cover the LED elements 5 is thermally cured, to thus become a resin 8* and fixed in each of the LED mounting regions 4b. Subsequently, the resin-cured board 4 is sent to the piece cutting device M6, where the board 4 is cut into the individual boards 4a. As shown in FIG. 12(d), individual LED packages 50 are then separated (ST9). The LED packages 50 are then completed.

The thus-completed LED packages 50 are carried in the light emission characteristic inspection device M7 (ST10), where each of the LED packages 50 is subjected to light emission characteristic inspection (ST11). Specifically, the light emission characteristic inspection device M7 inspects a light emission characteristic of each of the LED packages 50, to thus detect a deviation from the specified light emission characteristic and feed back an inspection result to the resin coating device M4. The resin coating device M4 received a feedback signal determines whether or not the thus-detected deviation exceeds an allowable value by means of the coating information update section 84 (ST12). When the deviation exceeds the allowable value, the coating information update section 84 updates the resin coating information 14 according to the detected deviation (ST13) and keeps on performing various operations, such as component mounting operation and resin coating operation, by use of the thus-updated resin coating information 14 (ST14). When the deviation is determined not to exceed the allowable value in (ST12), processing proceeds to (ST14) while the existing resin coating information 14 is maintained.

As mentioned above, the LED package manufacturing system 1 described in connection with the embodiment adopts a configuration including: the component mounting device M1 that mounts the plurality of LED elements 5 on the board 4; the element characteristic information providing unit that provides, as the element characteristic information 12, information obtained by previously, individually measuring light emission wavelengths of the plurality of LED elements 5; the resin information providing unit that provides, as the resin coating information 14, information about correspondence between an appropriate amount of resin 8 to be applied for acquiring an LED package 50 exhibiting a specified light emission characteristic and the element characteristic information 12; map data preparation unit that prepares, for each board 5, the map data 18 correlating the mounting position information 71a showing the position of the LED element 5 mounted on the board 4 by the component mounting device M1 and the element characteristic information 12 about the LED element 5; the resin coating device M4 that coats each of the LED elements mounted on the board 4 with the appropriate amount of resin 8 to be applied for imparting a specified light emission characteristic, on the basis of the map data 18 and the resin coating information 14; the light emission characteristic inspection device M7 that inspects the light emission characteristic of each of the LED elements 5 coated with the resin 8 to thereby detect a deviation from the specified light emission characteristic and that feeds back an inspection result to the resin coating device M4; and coating information update unit that performs processing for updating the resin coating information 14 on the basis of the fed-back inspection result when the detected deviation exceeds the allowable value.

The resin coating device M4 used in the LED package manufacturing system 1 having the foregoing configuration includes the resin discharge mechanism 37 that discharges the resin 8 fed from the resin feed section 38 by way of the discharge nozzle 33; the nozzle transfer mechanism 35 that relatively transfers the discharge nozzle 33 with respect to the board 4; and the coating control section 36 that controls the resin discharge mechanism 37 and the nozzle transferring mechanism 35 on the basis of the transmitted map data 18 and the resin coating information 14, thereby coating each of the LED elements 5 with the appropriate amount of resin 8 to be applied for exhibiting a specified light emission characteristic.

The appropriate amount of resin 8 to be applied can be applied at all times according to the light emission characteristic of the LED element 5 to be coated with the resin 8. Even when variations exist in light emission wavelengths of individual LED elements, the light emission characteristics of the LED packages can be made uniform, thereby enhancing a manufacturing yield. In an LED package manufacturing system for actual production purpose that is used after sufficient trial production to prepare for mass production, the resin coating information 14 can be fixedly applied. For this reason, the light emission characteristic inspection device M7 and the coating information update unit can be omitted from the LED package manufacturing system 1 having the foregoing configuration.

In connection with the LED package manufacturing system 1 having the foregoing configuration, there is illustrated a configuration in which the management computer 3 and the devices; namely, the component mounting device M1 to the light emission characteristic inspection device M7, are connected to each other by means of the LAN system 2. However, the LAN system 2 is not an indispensable constituent element. Specifically, the functions of the LED package manufacturing system 1 described in connection with the embodiment can be implemented, so long as there are storage unit for storing, for each of the LED packages 50, the element characteristic information 12 and the resin coating information 14 previously prepared and transmitted from the outside; data providing unit capable of providing, from the storage unit, the element characteristic information 12 to the component mounting device M1 and the resin coating information 14 and the map data 18 to the resin coating device M4 as needed basis at any time; and data transmission unit capable of feeding back an inspection result of the light emission characteristic inspection device M7 to the resin coating device M4.

The present invention is expected to be susceptible to various alterations and applications conceived by the persons skilled in the art without departing from the gist and scope of the present invention and on the basis of the descriptions of the present specification and the well known techniques, and the alterations and applications shall fall within a range where protection of the present invention is sought. Moreover, the constituent elements described in connection with the embodiment can also be used in arbitrary combination without departing the scope of the gist of the present invention.

The present patent application is based on Japanese Patent Application (JP-2010-201654) filed on Sep. 9, 2010, the entire subject matter of which is incorporated herein by reference in its entirety.

INDUSTRIAL APPLICABILITY

The LED package manufacturing system of the present invention yields an advantage of making light emission characteristics of LED packages uniform even when variations exist in light emission wavelengths of individual LED element, to thus enable enhancement of a manufacturing yield, and can be utilized in a field of manufacture of an LED package in which an LED element is coated with a resin including a fluorescent substance.

DESCRIPTIONS OF THE REFERENCE NUMERALS AND SYMBOLS

1 LED PACKAGE MANUFACTURING SYSTEM
2 LAN SYSTEM
4 BOARD
4a INDIVIDUAL BOARD
4b LED MOUNTING REGION
4c REFLECTION REGION
5 LED ELEMENT
50 LED PACKAGE
8 RESIN
12 ELEMENT CHARACTERISTIC INFORMATION
13A, 13B, 13C LED SHEET
14 RESIN COATING INFORMATION
18 MAP DATA
23 RESIN ADHESIVE
24 ADHESIVE TRANSFER MECHANISM
25 COMPONENT FEEDING MECHANISM
26 COMPONENT MOUNTING MECHANISM
32 RESIN DISCHARGE HEAD
33 DISCHARGE NOZZLE

The invention claimed is:

1. An LED package manufacturing system for manufacturing an LED package by coating an LED element mounted on a board with a resin including a fluorescent substance, comprising:
a component mounting device that mounts a plurality of LED elements on the board;
an element characteristic information providing unit that provides, as element characteristic information, information obtained by previously, individually measuring light emission characteristics of the plurality of LED elements including their emission wavelengths;
a resin information providing unit that provides, as resin coating information, information about correspondence between an appropriate amount of resin to be applied for acquiring an LED package exhibiting a specified light emission characteristic and the element characteristic information;
a map data preparation unit that prepares, for each board, map data correlating mounting position information showing position of the LED element mounted on the board by the component mounting device and the element characteristic information about the LED element;
a resin coating device that coats each of the LED elements mounted on the board with the appropriate amount of resin to be applied for imparting a specified light emission characteristic, on the basis of the map data and the resin coating information;
a light emission characteristic inspection device that inspects the light emission characteristic of each of the LED elements coated with the resin to thereby detect a deviation from the specified light emission characteristic and that feeds back an inspection result to the resin coating device; and
a coating information update unit that performs processing for updating the resin coating information on the basis of the fed-back inspection result when the detected deviation exceeds an allowable value.

2. The LED package manufacturing system according to claim 1, wherein the component mounting device, the resin coating device, and the light emission characteristic inspection device are all connected to a LAN system; the element characteristic information providing unit and the resin information providing unit transmit the element characteristic information and resin coating information, which have been read from an external storage unit, respectively to the component mounting device and the resin coating device by way of the LAN system; and the light emission characteristic inspection device transmits the inspection result to the resin coating device by way of the LAN system.

3. The LED package manufacturing system according to claim 1, wherein the map data preparation unit is provided in the component mounting device, and the map data are transmitted from the component mounting device to the resin coating device.

4. The LED package manufacturing system according to claim 1, wherein the coating information update unit is provided in the resin coating device.

* * * * *